(12) United States Patent
Nishigoori et al.

(10) Patent No.: US 10,497,790 B2
(45) Date of Patent: Dec. 3, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Masahito Nishigoori, Oto Tokyo (JP); Hiroyoshi Kitahara, Yokohama Kanagawa (JP); Yasushi Fukai, Kamakura Kanagawa (JP); Naozumi Terada, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/920,981

(22) Filed: Mar. 14, 2018

(65) Prior Publication Data

US 2019/0088753 A1 Mar. 21, 2019

(30) Foreign Application Priority Data

Sep. 15, 2017 (JP) ................................ 2017-178286

(51) Int. Cl.
*H01L 29/417* (2006.01)
*H01L 29/49* (2006.01)
*H01L 29/423* (2006.01)
*H01L 29/78* (2006.01)

(52) U.S. Cl.
CPC .. *H01L 29/41766* (2013.01); *H01L 29/41775* (2013.01); *H01L 29/4238* (2013.01); *H01L 29/4983* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 6,887,762 B1 | 5/2005 | Murthy et al. | |
| 7,300,848 B2 | 11/2007 | Jang | |
| 2017/0271508 A1* | 9/2017 | Heo | ........................ H01L 28/00 |

FOREIGN PATENT DOCUMENTS

| | | |
|---|---|---|
| JP | 2002-530864 A | 9/2002 |
| JP | 2009-111046 A | 5/2009 |
| JP | 4859455 B2 | 1/2012 |

* cited by examiner

*Primary Examiner* — Steven B Gauthier
(74) *Attorney, Agent, or Firm* — White & Case LLP

(57) ABSTRACT

A semiconductor device includes a semiconductor portion of a first conductivity type, a first semiconductor layer and a second semiconductor layer of a second conductivity type separated from each other and provided in an upper layer portion of the semiconductor portion, a gate electrode provided on the semiconductor portion, a first contact piercing the gate electrode, a second contact piercing the gate electrode, a first insulating film provided between the first semiconductor layer and a side surface of the first contact and between the first contact and the gate electrode, and a second insulating film provided between the second semiconductor layer and a side surface of the second contact and between the second contact and the gate electrode. A lower portion of the first contact is disposed inside the first semiconductor layer, a lower end of the first contact is connected to the first semiconductor layer.

9 Claims, 6 Drawing Sheets

SEMICONDUCTOR DEVICE

CROSS-REFERENCE TO RELATED APPLICATIONS

This application is based upon and claims the benefit of priority from Japanese Patent Application No. 2017-178286, filed on Sep. 15, 2017; the entire contents of which are incorporated herein by reference.

FIELD

Embodiments relate to a semiconductor device.

BACKGROUND

There are cases where it is desirable for a transistor included in an analog circuit to have a stable drain current in the saturated region.

DETAILED DESCRIPTION

A semiconductor device according to one embodiment includes a semiconductor portion of a first conductivity type, a first semiconductor layer and a second semiconductor layer separated from each other and provided in an upper layer portion of the semiconductor portion, a gate electrode provided on the semiconductor portion, a first contact piercing the gate electrode, a second contact piercing the gate electrode, a first insulating film provided between the first semiconductor layer and a side surface of the first contact and between the first contact and the gate electrode, and a second insulating film provided between the second semiconductor layer and a side surface of the second contact and between the second contact and the gate electrode. The first semiconductor layer and the second semiconductor layer are a second conductivity type. A lower portion of the first contact is disposed inside the first semiconductor layer, a lower end of the first contact is connected to the first semiconductor layer. A lower portion of the second contact is disposed inside the second semiconductor layer, a lower end of the second contact is connected to the second semiconductor layer.

First Embodiment

A first embodiment will now be described.

Figure 1A:
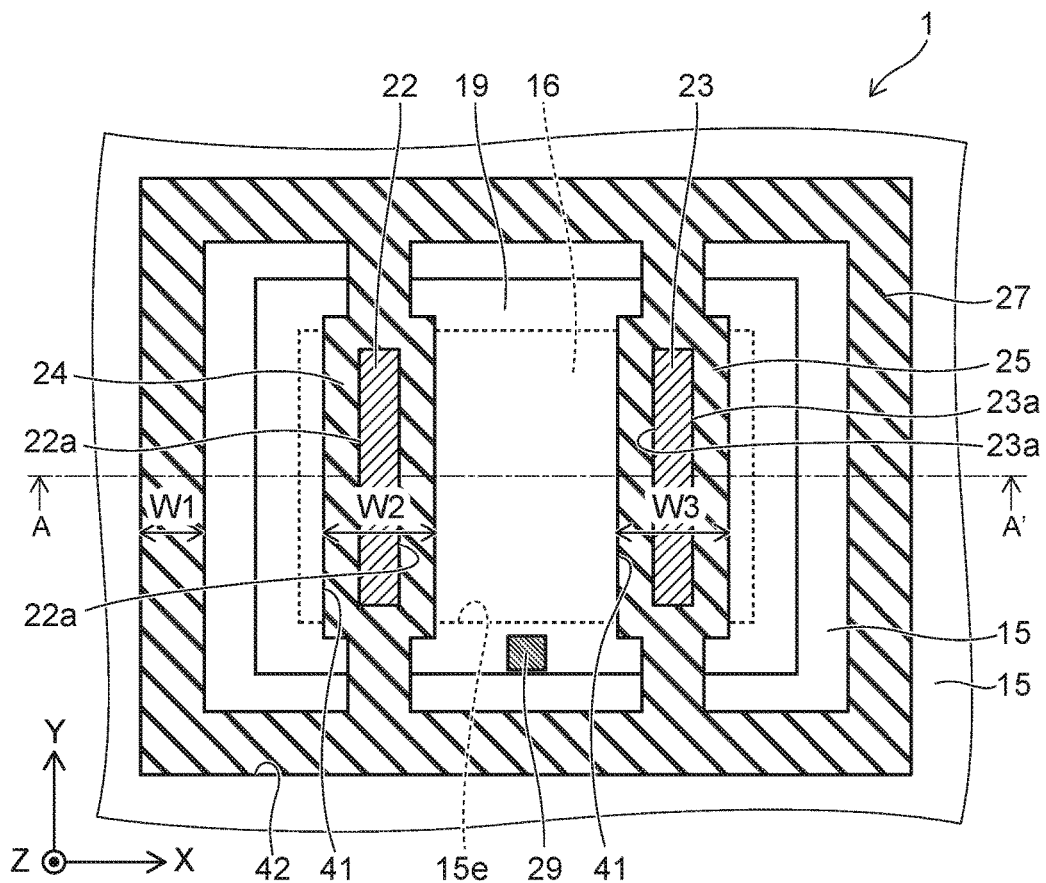
FIG. 1A is a cross-sectional view showing a semiconductor device according to a first embodiment.
Figure 1B:
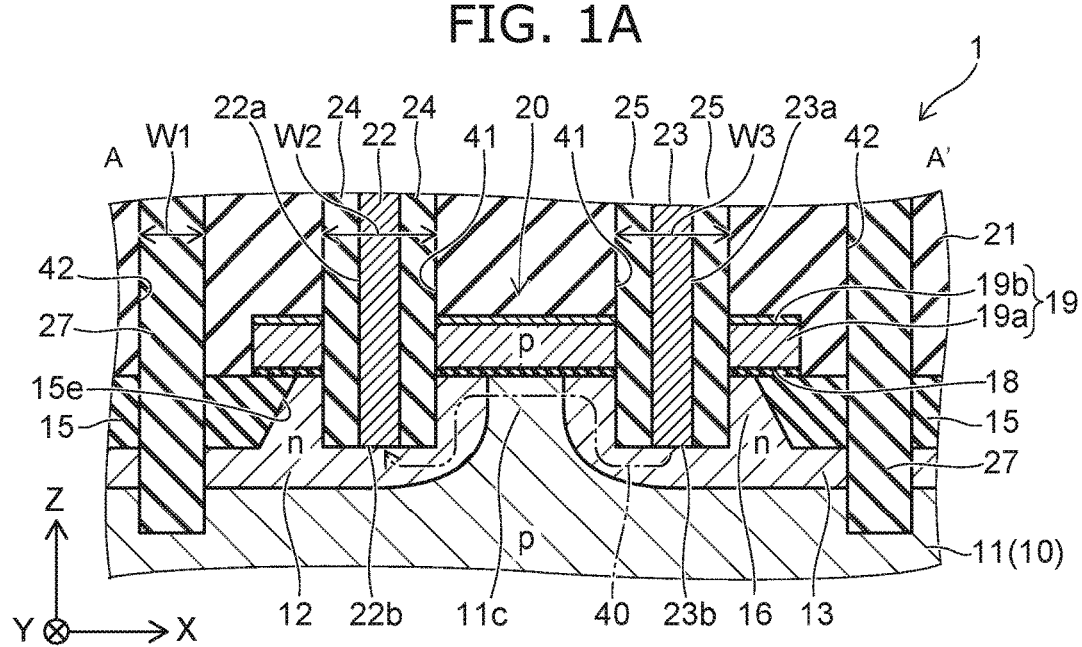
FIG. 1B is a cross-sectional view along line A-A' shown in FIG. 1A.

FIG. 1A is a cross-sectional view showing a semiconductor device according to the embodiment; and FIG. 1B is a cross-sectional view along line A-A' shown in FIG. 1A.

The semiconductor device according to the embodiment is, for example, a semiconductor device in which an analog circuit is formed.

As shown in FIGS. 1A and 1B, a silicon substrate 10 is provided in the semiconductor device 1 according to the embodiment. A p-type well 11 of a p-type conductivity type is formed in a portion of the upper layer portion of the silicon substrate 10. An impurity that forms acceptors, e.g., boron (B) is included in the p-type well 11. Two n-type layers 12 and 13 of an n-type conductivity type are separated from each other and are provided in the upper layer portion of the p-type well 11. An impurity that forms donors, e.g., phosphorus (P) is included in the n-type layers 12 and 13.

For convenience hereinbelow, among two mutually-orthogonal directions parallel to the upper surface of the silicon substrate 10, the arrangement direction of the n-type layer 12 and the n-type layer 13 is taken as an "X-direction;" and the other direction is taken as a "Y-direction." A direction orthogonal to the X-direction and the Y-direction is taken as a "Z-direction."

A STI (Shallow Trench Isolation (element-separating insulating film)) 15 is provided on the p-type well 11, on the n-type layer 12, and on the n-type layer 13 to surround a portion 11c of the p-type well 11 between the n-type layer 12 and the n-type layer 13, the portion of the n-type layer 12 contacting the portion 11c, and the portion of the n-type layer 13 contacting the portion 11c. The portions of the p-type well 11, the n-type layer 12, and the n-type layer 13 surrounded with the STI 15 are called an active area 16. When viewed from above, i.e., the Z-direction, an inner edge 15e of the STI 15 is disposed inside a gate electrode 19. In other words, when viewed from above, the end portion of the gate electrode 19 overlaps the STI 15.

A gate insulating film 18 that is made of, for example, silicon oxide is provided on portions of the active area 16 and the STI 15 contacting the active area 16. The gate electrode 19 is provided on the gate insulating film 18. The gate electrode 19 includes a polysilicon portion 19a, and a salicide layer 19b formed on the upper surface of the polysilicon portion 19a. The polysilicon portion 19a includes polysilicon as a main material and includes an impurity that forms acceptors for silicon, e.g., boron. The salicide layer 19b is made of a metal silicide.

An n-channel transistor 20 is formed of the portion 11c of the p-type well 11, the n-type layer 12, the n-type layer 13, the gate insulating film 18, and the gate electrode 19. In the n-channel transistor 20, the portion 11c is used as a channel; and the n-type layers 12 and 13 are used as a source and a drain. An inter-layer insulating film 21 is provided on the silicon substrate 10, the STI 15, the gate insulating film 18, and the gate electrode 19. The STI 15 and the inter-layer insulating film 21 are formed of the same insulating material, e.g., silicon oxide (SiO). FIG. 1A shows an XY cross section including the upper surface of the gate electrode 19. In FIG. 1A, the inter-layer insulating film 21 is not illustrated for convenience of illustration. This is similar for FIG. 5A and FIG. 6A described below as well.

Contacts 22 and 23 are provided in the semiconductor device 1. The contacts 22 and 23 are formed of a conductive material, e.g., a metal, e.g., tungsten (W). The contact 22 and the contact 23 are separated from each other in the X-direction. The configurations of the contacts 22 and 23 are, for example, band configurations that extend in the Z-direction and have lengths in the Y-direction that are longer than the lengths in the X-direction. The upper portions of the contacts 22 and 23 are disposed inside the inter-layer insulating film 21; and the upper ends are connected to mutually-different upper layer interconnects (not illustrated). The contacts 22 and 23 pierce the gate electrode 19 and the gate insulating film 18. The lower portion of the contact 22 is disposed inside the n-type layer 12. The lower portion of the contact 23 is disposed inside the n-type layer 13.

An insulating film 24 is provided on a side surface 22a of the contact 22. The insulating film 24 is disposed between the n-type layer 12 and the side surface 22a of the contact 22, between the side surface 22a and the gate electrode 19, and between the side surface 22a and the inter-layer insulating film 21. A lower end 22b of the contact 22 is positioned lower than the upper surface of the n-type layer 12. The lower end 22b contacts the n-type layer 12. Thereby, the contact 22 is connected to the n-type layer 12 via the lower end 22b.

Similarly, an insulating film 25 is provided on a side surface 23a of the contact 23. The insulating film 25 is disposed between the n-type layer 13 and the side surface 23a of the contact 23, between the side surface 23a and the gate electrode 19, and between the side surface 23a and the inter-layer insulating film 21. A lower end 23b of the contact 23 is positioned lower than the upper surface of the n-type layer 13. The lower end 23b contacts the n-type layer 13. Thereby, the contact 23 is connected to the n-type layer 13 via the lower end 23b.

Also, a DTI (Deep Trench Isolation) 27 is provided as an insulating member in the semiconductor device 1. The insulating film 24, the insulating film 25, and the DTI 27 are formed of an insulating material that is different from the STI 15 and the inter-layer insulating film 21, e.g., silicon nitride (SiN). The insulating film 24, the insulating film 25, and the DTI 27 may be formed of the same silicon oxide (SiO) as the STI 15 and the inter-layer insulating film 21.

When viewed from the Z-direction, the configuration of the DTI 27 is a substantially frame-like configuration surrounding the n-channel transistor 20. In other words, when viewed from the Z-direction, the gate electrode 19, the gate insulating film 18, the contact 22, the insulating film 24, the contact 23, the insulating film 25, and the active area 16 are disposed on the inner side of the DTI 27. The DTI 27 pierces the inter-layer insulating film 21, the STI 15, the n-type layer 12, and the n-type layer 13; and the lower end of the DTI 27 is positioned inside the p-type well 11. Accordingly, the lower end of the DTI 27 is positioned lower than the lower end of the STI 15 and positioned lower than the lower end 22b of the contact 22 and the lower end 23b of the contact 23. The n-channel transistor 20 is electrically isolated from the periphery by the DTI 27.

When viewed from the Z-direction, a minimum width W1 of the DTI 27 is narrower than a minimum width W2 of the structure body made of the contact 22 and the insulating film 24 and narrower than a minimum width W3 of the structure body made of the contact 23 and the insulating film 25. In other words, W1<W2 and W1<W3.

The DTI 27 protrudes inward at the two Y-direction sides of the contact 22 and the two Y-direction sides of the contact 23 and reaches the insulating film 24 and the insulating film 25. The DTI 27 is formed as one body with the insulating films 24 and 25. Thereby, the insulating film 24, the insulating film 25, and the DTI 27 divide the gate electrode 19 into three portions arranged along the X-direction.

A contact 29 is provided inside the inter-layer insulating film 21 on a portion of the gate electrode 19. Among the three portions of the gate electrode 19, the lower end of the contact 29 is connected to the portion disposed between the insulating film 24 and the insulating film 25.

Although an example is shown in the embodiment in which the n-channel transistor 20 is formed, the conductivity types of the p-type well 11, the n-type layer 12, and the n-type layer 13 may be reversed; and a p-channel transistor may be formed.

A method for manufacturing the semiconductor device according to the embodiment will now be described.

FIGS. 2A and 2B and FIGS. 3A and 3B are cross-sectional views showing the method for manufacturing the semiconductor device according to the embodiment, and show cross sections corresponding to FIG. 1B.

Figure 2A:
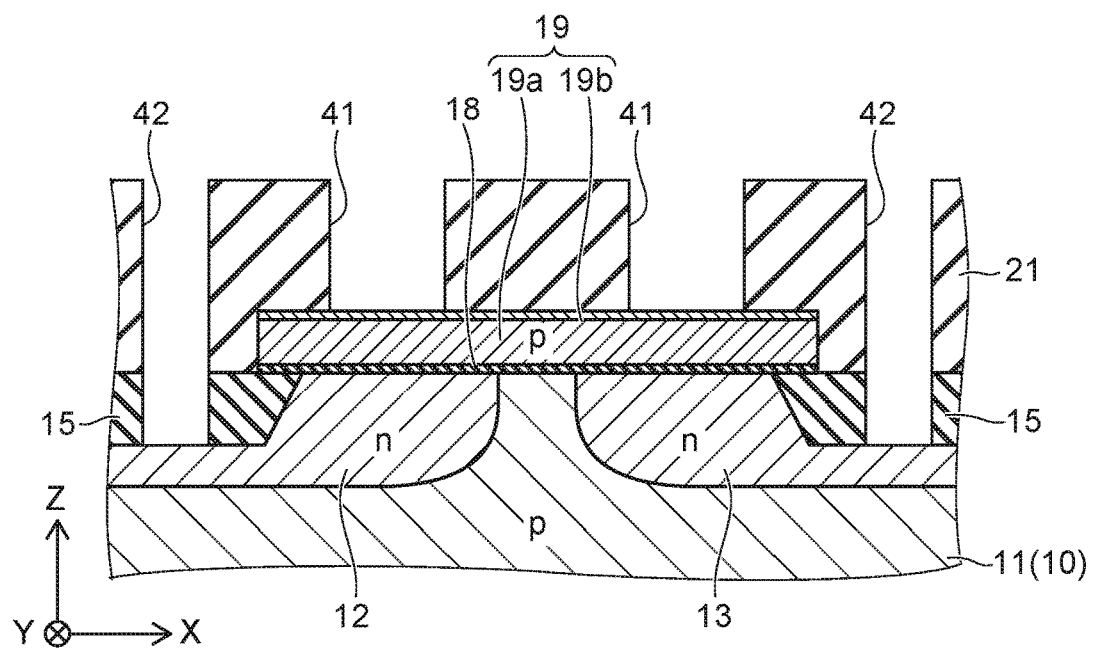
FIGS. 2A and 2B and FIGS. 3A and 3B are cross-sectional views showing a method for manufacturing the semiconductor device according to the first embodiment.

First, as shown in FIG. 2A, the STI 15 is formed in a portion of the upper layer portion of the silicon substrate 10; the p-type well 11 is formed; and the n-type layers 12 and 13 are formed in a portion of the upper layer portion of the p-type well 11. Then, the gate insulating film 18 is formed on the silicon substrate 10 and on the STI 15; and the gate electrode 19 is formed by depositing polysilicon on the gate insulating film 18 and by saliciding the upper surface of the polysilicon. Then, an impurity that forms acceptors, e.g., boron is ion-implanted into the gate electrode 19. Then, the inter-layer insulating film 21 is formed by depositing silicon oxide on the entire surface of the silicon substrate 10.

Then, anisotropic etching such as RIE (Reactive Ion Etching) or the like of the inter-layer insulating film 21 is performed. Thereby, openings 41 that pierce the inter-layer insulating film 21 and reach the gate electrode 19 are formed; and an opening 42 that pierces the inter-layer insulating film 21 and the STI 15 and reaches the n-type layers 12 and 13 is formed. The configurations of the openings 41 are trench configurations extending in the Y-direction; and the configuration of the opening 42 is a frame-like configuration surrounding the gate electrode 19. The width of the opening 42 is set to be narrower than the widths of the openings 41. The gate electrode 19 and the gate insulating film 18 are divided into three along the X-direction by the openings 41 and 42.

The anisotropic etching is performed using conditions such that the etching rate of silicon oxide is higher than the etching rate of silicon. Thereby, the inter-layer insulating film 21 and the STI 15 that are made of silicon oxide are etched preferentially to the n-type layers 12 and 13 and the gate electrode 19 made of silicon. As a result, the opening 42 is deeper than the openings 41.

Figure 2B:
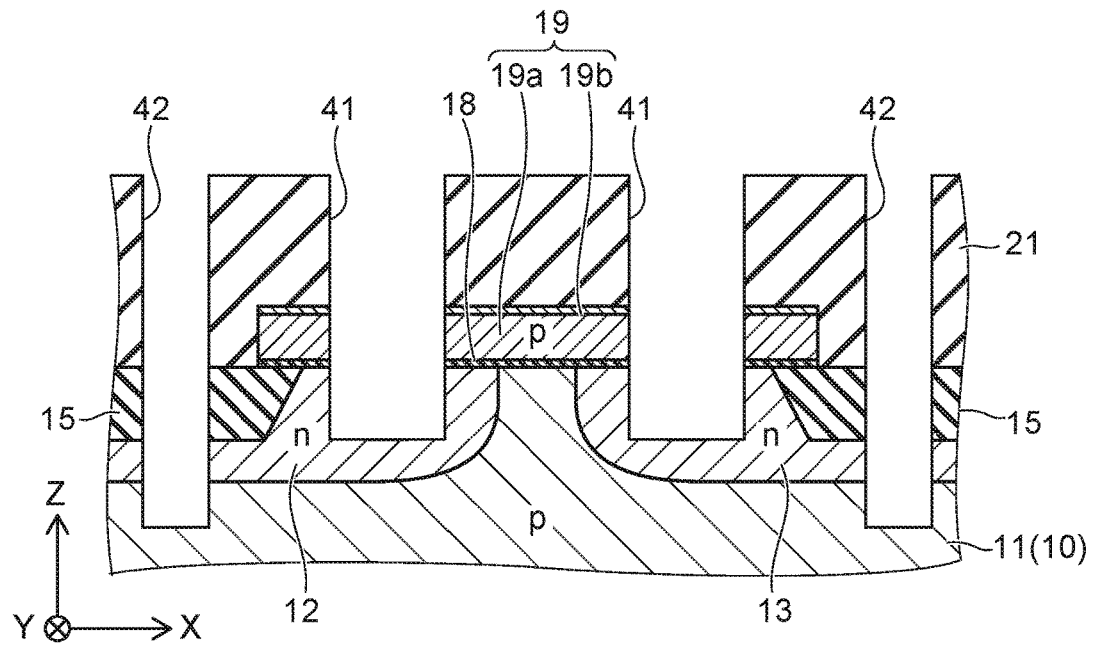

Then, as shown in FIG. 2B, anisotropic etching such as RIE or the like is performed using conditions providing low selectivity. Thereby, the openings 41 and 42 extend downward. As a result, the openings 41 pierce the gate electrode 19 and the gate insulating film 18; and the lower ends of the openings 41 reach the interior of the n-type layer 12 and the interior of the n-type layer 13. On the other hand, the opening 42 pierces the n-type layers 12 and 13; and the lower end of the opening 42 reaches the interior of the p-type well 11.

Figure 3A:
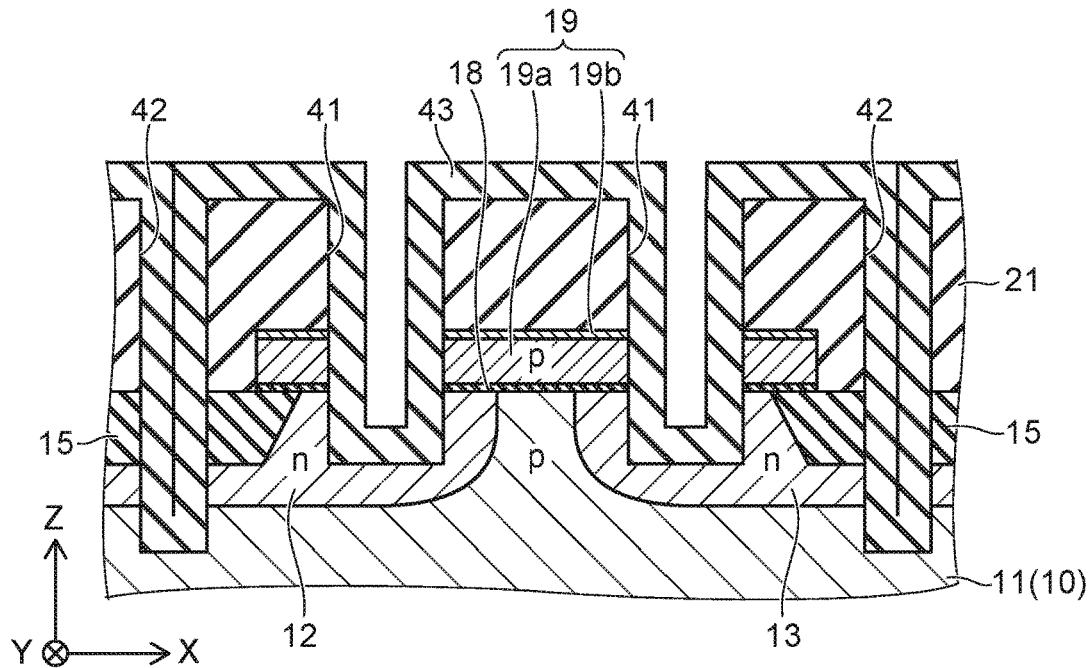

Continuing as shown in FIG. 3A, a silicon nitride film 43 is formed on the entire surface by depositing silicon nitride. The thickness of the silicon nitride film 43 is a thickness such that the interiors of the openings 41 are not completely filled; but the interior of the opening 42 is completely filled. The silicon nitride film 43 is formed on the inner surfaces of the openings 41.

Figure 3B:
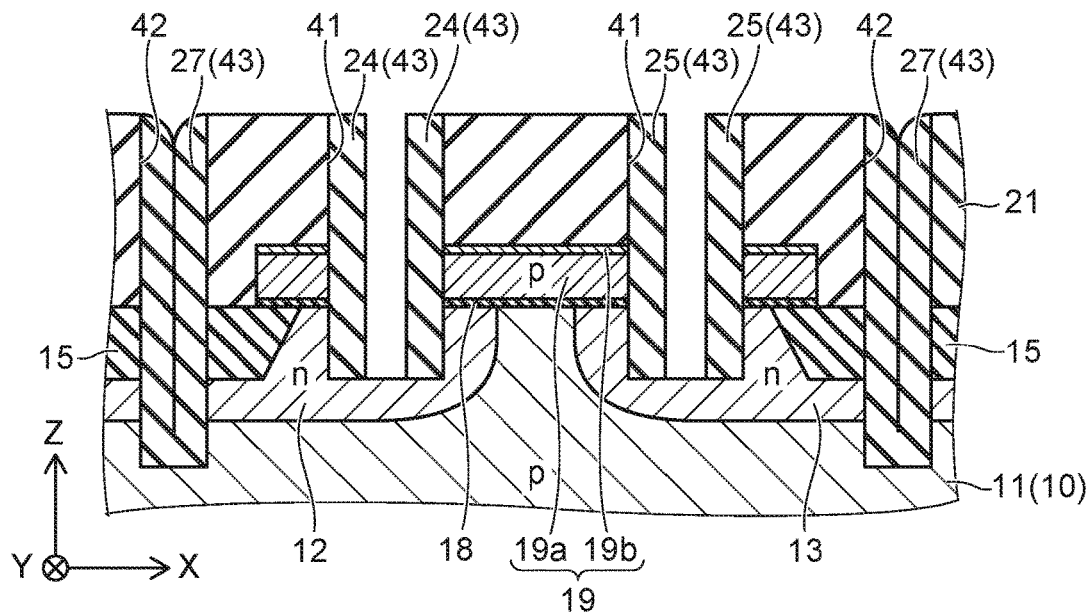

Then, as shown in FIG. 3B, etch-back of the silicon nitride film 43 is performed by performing anisotropic etching such as RIE, etc., from above. Thereby, the silicon nitride film 43 that is on the upper surface of the inter-layer insulating film 21 and on the lower surfaces of the openings 41 is removed. The portion of the silicon nitride film 43 remaining on the side surfaces of the openings 41 becomes the insulating films 24 and 25. On the other hand, because the opening 42 is filled by the silicon nitride film 43, etch-back of the silicon nitride film 43 inside the opening 42 is substantially not performed; and the silicon nitride film 43 inside the opening 42 remains and becomes the DTI 27.

Continuing as shown in FIGS. 1A and 1B, a contact hole that reaches the gate electrode 19 is formed in the inter-layer insulating film 21. Then, for example, by depositing tungsten and performing etch-back, the contact 22 is formed in the portion inside the opening 41 surrounded with the insulating film 24; the contact 23 is formed in the portion inside the opening 41 surrounded with the insulating film 25; and the contact 29 that is connected to the gate electrode 19 is formed inside the contact hole. Thus, the semiconductor device 1 according to the embodiment is manufactured.

Effects of the embodiment will now be described.

Figure 4:
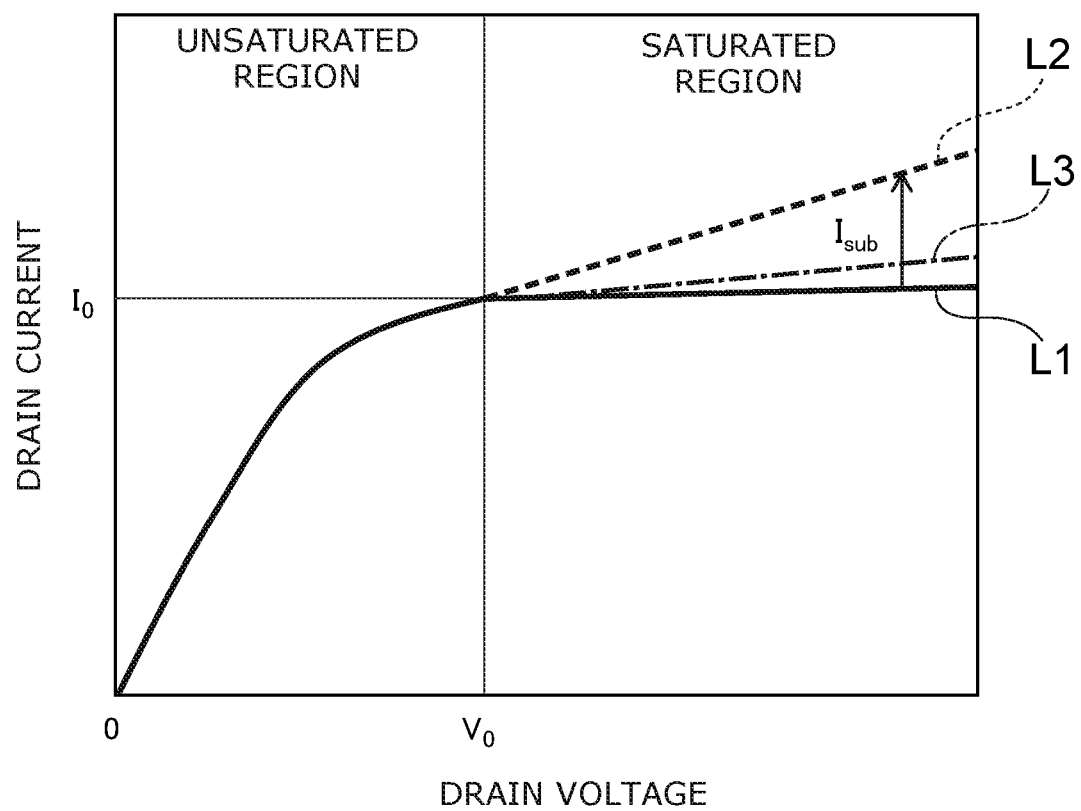
FIG. 4 is a graph showing an I-V characteristic of a n-channel transistor of the first embodiment, in which the horizontal axis is a drain voltage, and the vertical axis is a drain current.

FIG. 4 is a graph showing the I-V characteristic of the n-channel transistor of the embodiment, in which the horizontal axis is the drain voltage, and the vertical axis is the drain current.

For example, as shown by line L1 of FIG. 4 for the ideal I-V characteristic of a transistor used in some types of analog circuits, the drain current increases as the drain voltage increases when the drain voltage is in an unsaturated region from zero to a prescribed voltage $V_0$; and when the drain voltage is in a saturated region higher than the prescribed voltage $V_0$, it is favorable for the drain current to be stable at a constant value $I_0$.

However, actually, as the drain voltage is increased, hot carriers are generated at the interface between the channel and the drain; and a sub-current $I_{sub}$ that is caused by the hot carriers undesirably flows between the source and the drain. Therefore, even in the saturated region as shown by line L2 of FIG. 4, the drain current undesirably increases as the drain voltage increases.

Therefore, in the embodiment as shown in FIG. 1B, the contacts 22 and 23 extend to the interior of the n-type layer 12 and the interior of the n-type layer 13 which are used to form the source and the drain of the n-channel transistor 20; the side surface of the contact 22 is covered with the insulating film 24; and the side surface of the contact 23 is covered with the insulating film 25. Thereby, the contact 22 is connected to the n-type layer 12 at the lower end 22b of the contact 22; and the contact 23 is connected to the n-type layer 13 at the lower end 23b of the contact 23. By extending a path 40 along the Z-direction, the size in the X-direction of the n-channel transistor 20 can be reduced.

As a result, as shown in FIG. 1B, because a portion of the path 40 of the drain current extends in the Z-direction, the path 40 is lengthened; and the resistance of the path 40 inside the n-type layer 12 and inside the n-type layer 13 increases. As a result, even if the hot carriers are generated, a voltage drop occurs due to the resistance of the path 40; and the sub-current $I_{sub}$ decreases. Thereby, in the saturated region as shown by line L3 of FIG. 4, the drain voltage dependence of the drain current decreases; and the drain current is stable.

Because the thickness of the STI 15 is determined by the design of the entire semiconductor device 1, it is difficult to select the thickness of the STI 15 based on only the demands of the n-channel transistor 20; but the depths of the contacts 22 and 23 can be selected relatively freely. By selecting the depths of the contacts 22 and 23, the resistance of the path 40 can be adjusted to any value.

In the embodiment, the gate electrode 19 is subdivided into three portions by the insulating films 24 and 25 and the DTI 27; and the gate potential is applied via the contact 29 only to the center portion. Therefore, the effective surface area of the gate electrode 19 is reduced; and the gate-drain capacitance is reduced.

In the semiconductor device 1 according to the embodiment as shown in FIGS. 1A and 1B, the gate electrode 19 is formed on the entire region directly above the active area 16; and the end portion of the gate electrode 19 is formed on the STI 15. Thereby, the gate electrode 19 overlaps the STI 15. As a result, in the process shown in FIG. 2A, because the silicon substrate 10 is not exposed at the side of the gate electrode 19 when ion-implanting the impurity into the gate electrode 19, the mixing of the impurity into the n-type layers 12 and 13 can be suppressed. Therefore, it is unnecessary to strictly control the implantation region of the impurity when implanting the impurity into the gate electrode 19. Thereby, for example, it is easy to set the conductivity type of the gate electrode 19 to be the p-type which is the reverse of the conductivity type of the n-type layers 12 and 13. By setting the conductivity type of the gate electrode to be the reverse of the conductivity type of the source and the drain, the 1/f noise can be reduced.

Because the gate electrode 19 and the STI 15 overlap, the silicon substrate 10 is not exposed at the side of the gate electrode 19 when saliciding the upper surface of the gate electrode 19 in the process shown in FIG. 2A. Therefore, a salicide block for suppressing the saliciding of the silicon substrate 10 is unnecessary; the processes can be simplified; and a salicide can be formed on the entire upper surface of the gate electrode 19.

In the process shown in FIGS. 2A and 2B, the opening 42 can be formed to be deeper than the openings 41 in the same etching process by forming the openings 41 in the region directly above the gate electrode 19 and by forming the opening 42 in the region directly above the STI 15. Also, by forming the opening 42 to be narrower than the openings 41, the silicon nitride film 43 that is on the bottom surfaces of the openings 41 can be removed while causing the silicon nitride film 43 to remain in substantially the entire interior of the opening 42 in the process shown in FIGS. 3A and 3B. As a result, the contacts 22 and 23 that are for adjusting the resistance of the path 40 can be formed simultaneously in the same process as the DTI 27 that is for electrically isolating the n-channel transistor 20 from the periphery.

Second Embodiment

A second embodiment will now be described.

Figure 5A:
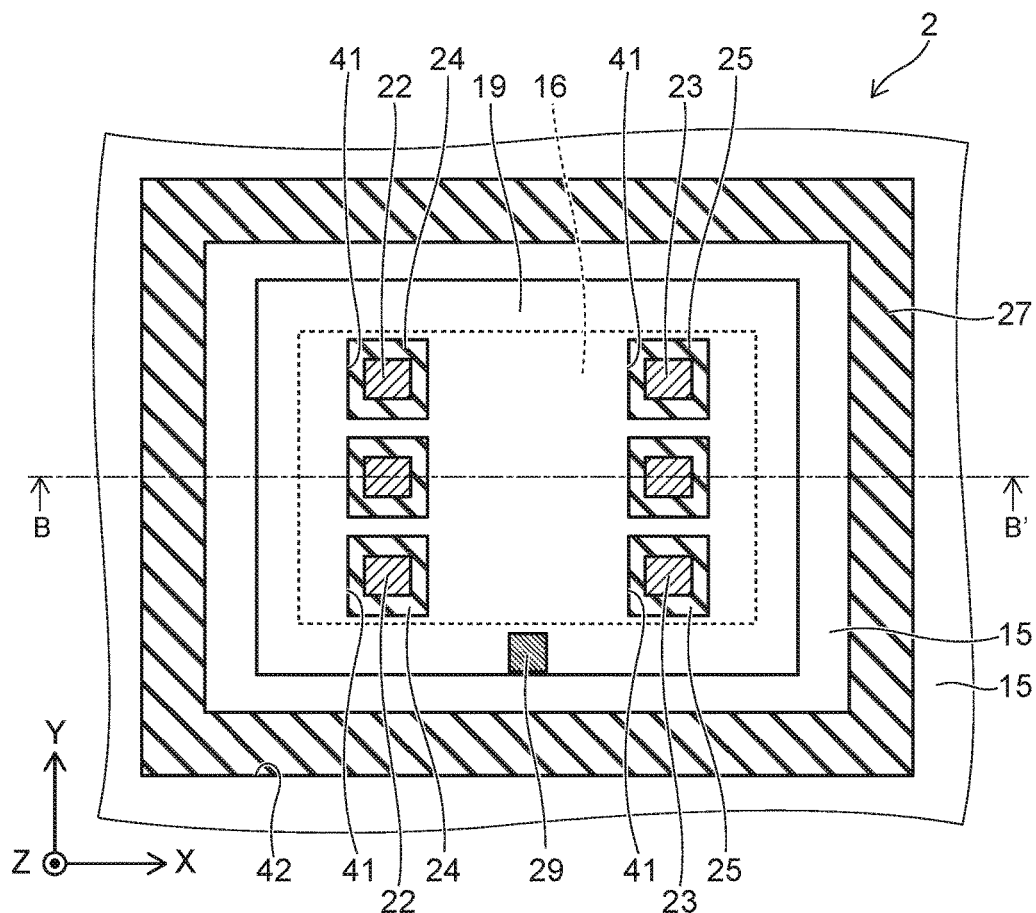
FIG. 5A is a cross-sectional view showing a semiconductor device according to a second embodiment.
Figure 5B:
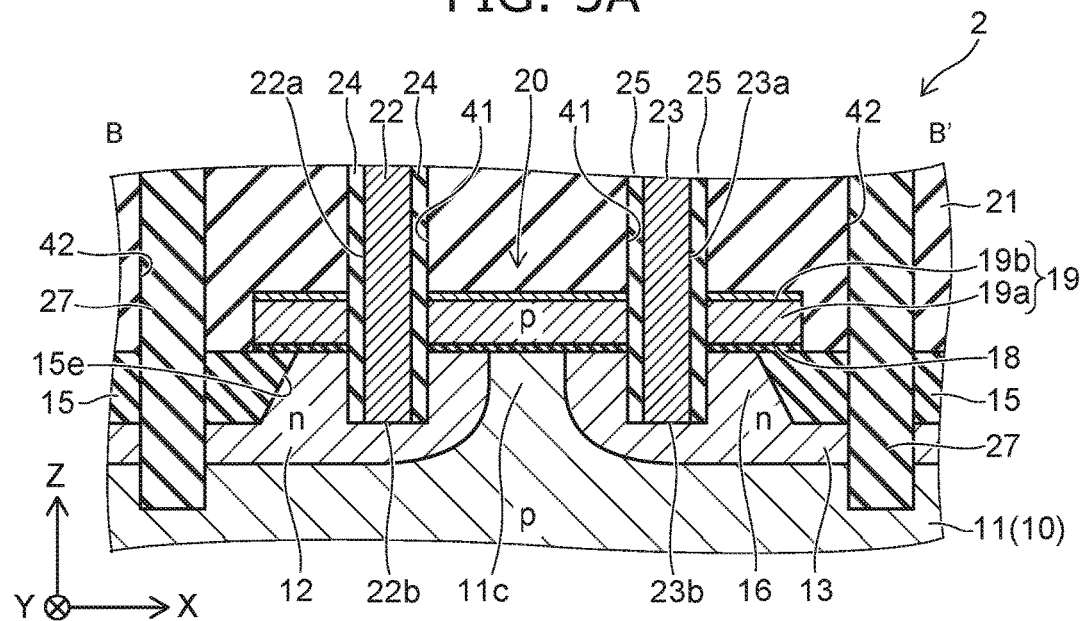
FIG. 5B is a cross-sectional view along line B-B' shown in FIG. 5A.

FIG. 5A is a cross-sectional view showing a semiconductor device according to the embodiment; and FIG. 5B is a cross-sectional view along line B-B' shown in FIG. 5A.

As shown in FIGS. 5A and 5B, the semiconductor device 2 according to the embodiment differs from the semiconductor device 1 according to the first embodiment described above (referring to FIGS. 1A and 1B) in that the contacts 22 and 23 each are multiply provided; the insulating films 24 are provided at the peripheries of the contacts 22; and the insulating films 25 are provided at the peripheries of the contacts 23. Also, the DTI 27 is separated from the insulating films 24 and 25. Therefore, the gate electrode 19 is not divided.

According to the embodiment, in the process shown in FIG. 2A, the formation of the openings 41 is easy because the openings 41 can be formed not in trench configurations but in hole configurations.

Otherwise, the configuration, the manufacturing method, and the effects of the embodiment are similar to those of the first embodiment described above.

Third Embodiment

A third embodiment will now be described.

Figure 6A:
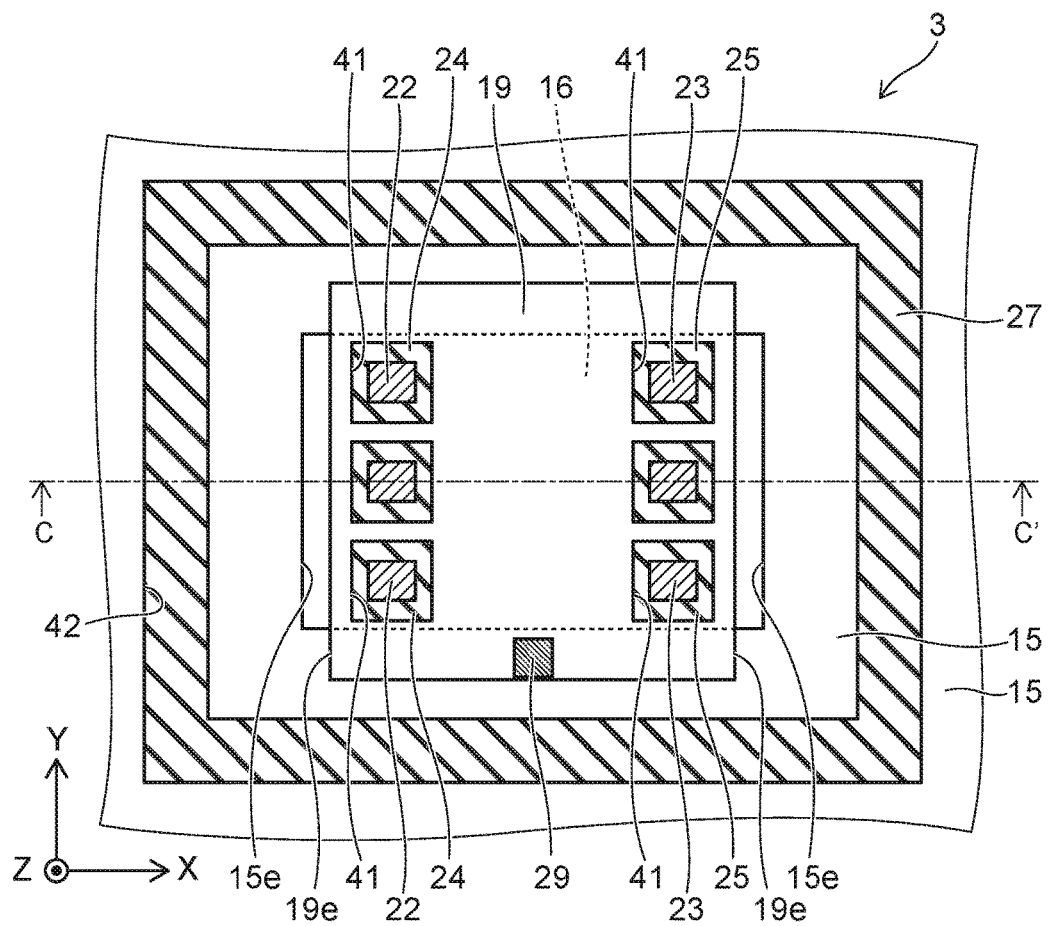
FIG. 6A is a cross-sectional view showing a semiconductor device according to a third embodiment.
Figure 6B:
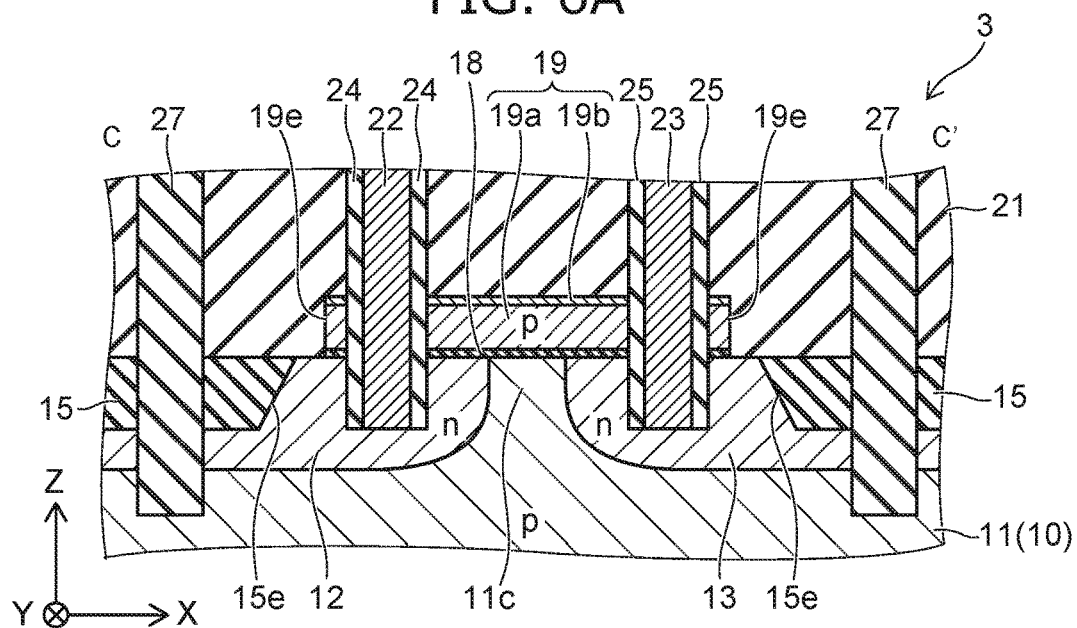
FIG. 6B is a cross-sectional view along line C-C' shown in FIG. 6A.

FIG. 6A is a cross-sectional view showing a semiconductor device according to the embodiment; and FIG. 6B is a cross-sectional view along line C-C' shown in FIG. 6A.

As shown in FIGS. 6A and 6B, the semiconductor device 3 according to the embodiment differs from the semiconductor device 2 according to the second embodiment described above (referring to FIGS. 5A and 5B) in that the two X-direction end edges 19e of the gate electrode 19 are disposed further inward than the two X-direction inner edges 15e of the STI 15.

According to the embodiment, compared to the second embodiment described above, the gate-drain capacitance is smaller because the surface area of the gate electrode 19 is small.

Otherwise, the configuration, the manufacturing method, and the effects of the embodiment are similar to those of the second embodiment described above.

According to the embodiments described above, a semiconductor device can be realized in which the drain current is stable in the saturated region of a transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
a semiconductor portion of a first conductivity type;
a first semiconductor layer and a second semiconductor layer separated from each other and provided in an upper layer portion of the semiconductor portion, the first semiconductor layer and the second semiconductor layer being of a second conductivity type;
a gate electrode provided on the semiconductor portion;
a first contact piercing the gate electrode, a lower portion of the first contact being disposed inside the first semiconductor layer, a lower end of the first contact being connected to the first semiconductor layer;
a second contact piercing the gate electrode, a lower portion of the second contact being disposed inside the second semiconductor layer, a lower end of the second contact being connected to the second semiconductor layer;
a first insulating film provided between the first semiconductor layer and a side surface of the first contact and between the first contact and the gate electrode; and
a second insulating film provided between the second semiconductor layer and a side surface of the second contact and between the second contact and the gate electrode.

2. The device according to claim 1, further comprising:
a third insulating film surrounding a first portion, a portion of the first semiconductor layer contacting the first portion, and a portion of the second semiconductor layer contacting the first portion, the first portion being of the semiconductor portion and being positioned between the first semiconductor layer and the second semiconductor layer; and
an insulating member surrounding the gate electrode and piercing the third insulating film, the first semiconductor layer, and the second semiconductor layer.

3. The device according to claim 2, wherein
the first insulating film, the second insulating film, and the insulating member are made from a first insulating material, and
when viewed from above, a minimum width of the insulating member is narrower than a minimum width of a structure body made of the first contact and the first insulating film.

4. The device according to claim 3, further comprising an inter-layer insulating film provided around the first contact, the second contact, and the insulating member,
the third insulating film and the inter-layer insulating film being made of a second insulating material different from the first insulating material.

5. The device according to claim 2, wherein the first insulating film and the second insulating film are formed as one body with the insulating member.

6. The device according to claim 2, wherein the first insulating film and the second insulating film are separated from the insulating member.

7. The device according to claim 2, further comprising a third contact,
the gate electrode being subdivided into three portions by the first insulating film, the second insulating film, and the insulating member, the three portions being arranged along a direction, the direction being from the first semiconductor layer toward the second semiconductor layer,
the third contact being connected to the portion disposed between the first insulating film and the second insulating film.

8. The device according to claim 1, further comprising a third insulating film surrounding a channel portion of the semiconductor portion, surrounding a portion of the first semiconductor layer contacting the channel portion, and surrounding a portion of the second semiconductor layer contacting the channel portion, the channel portion being positioned between the first semiconductor layer and the second semiconductor layer,
when viewed from above, an inner edge of the third insulating film being disposed inside the gate electrode.

9. The device according to claim 1, wherein
the gate electrode includes the same semiconductor material as a semiconductor material included in the semiconductor portion, and
the gate electrode includes the same impurity as an impurity included in the semiconductor portion.

* * * * *